United States Patent [19]
McGann

[11] Patent Number: 5,121,077
[45] Date of Patent: Jun. 9, 1992

[54] CIRCUIT FOR REDUCING DISTORTION PRODUCED BY AN R.F. POWER AMPLIFIER

[75] Inventor: Melvyn McGann, Chelmsford, United Kingdom

[73] Assignee: The Marconi Company Limted, Stanmore, United Kingdom

[21] Appl. No.: 653,010

[22] Filed: Jan. 30, 1991

[30] Foreign Application Priority Data
Feb. 8, 1990 [GB] United Kingdom ............... 9002789

[51] Int. Cl.$^5$ .............................................. H03F 1/32
[52] U.S. Cl. ................................... 330/149; 330/107; 455/126
[58] Field of Search ........................ 330/107, 109, 149; 328/155; 332/159, 161, 162; 307/511; 455/126

[56] References Cited

U.S. PATENT DOCUMENTS

| | | | |
|---|---|---|---|
| 3,831,094 | 8/1974 | Stover | 332/161 X |
| 4,554,514 | 11/1985 | Whartenby et al. | 330/149 |
| 4,600,892 | 7/1986 | Wagner et al. | 330/149 X |

FOREIGN PATENT DOCUMENTS

| | | |
|---|---|---|
| 2015812 | 4/1971 | Fed. Rep. of Germany . |
| 1246209 | 9/1971 | United Kingdom . |
| 1474952 | 5/1977 | United Kingdom . |
| 2135546 | 8/1984 | United Kingdom . |
| 2150378 | 6/1985 | United Kingdom . |

Primary Examiner—Steven Mottola
Attorney, Agent, or Firm—Spencer, Frank & Schneider

[57] ABSTRACT

A high frequency SSB radio transmitter has an envelope amplitude modulator for varying the envelope of an r.f. signal source based on an error signal from envelope detectors detecting the envelope of the input and output waveform. It also has a first phase modulator in a main feedback loop for varying the phase of the input waveform based on differences detected in a phase detector between the instantaneous phase of the input and output r.f. signal. To overcome the problem of spurious outputs from the phase detector resulting from the cross-over points of the SSB waveform when there are carrier breaks and other problems, a subsidiary, phase lock loop feeds a signal derived from the error signal to a second phase modulator to tend to hold the inputs to the phase detector in such a phase relationship that the output is zero. To cope with large phase shift errors between the input waveform and the output which result when the power amplifier changes frequency or temperature variations e.g. at the antenna, a broadband phase shifting network is brought into operation when a dual voltage comparator senses that the signal fed to the second modulator passes a value corresponding to its extremes of adjustment.

16 Claims, 3 Drawing Sheets

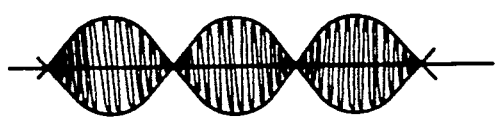
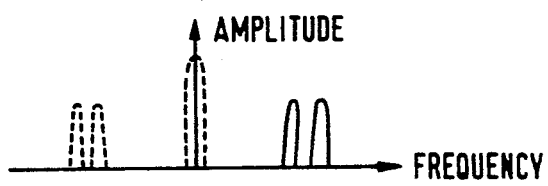
FIG. 2  FIG. 3
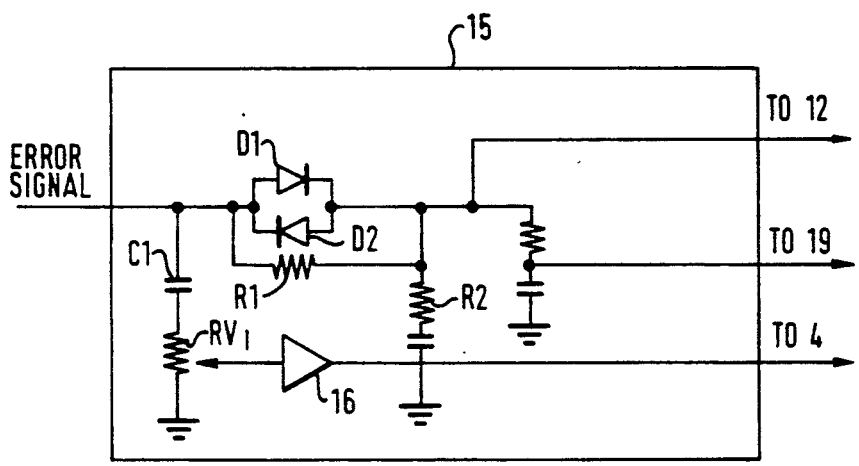
FIG. 4
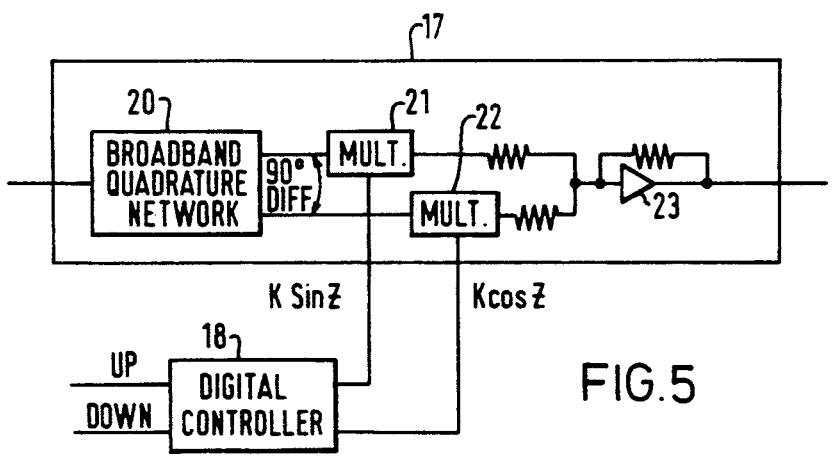
FIG. 5

CIRCUIT FOR REDUCING DISTORTION PRODUCED BY AN R.F. POWER AMPLIFIER

BACKGROUND OF THE INVENTION

This invention relates to circuits for reducing distortion produced by an r.f. power amplifier, particularly but not exclusively for SSB (Single Side Band) transmitters.

When an r.f. signal is amplified, any non-linearity in the amplifier will cause envelope amplitude and/or phase distortion of the output compared to the r.f. signal source (drive waveform). This will result in intermodulation distortion of the amplified r.f. signal.

It has been proposed (GB-A-1246209) to compensate for any distortion produced by an r.f. amplifier by separately correcting for envelope amplitude deviations and r.f. phase deviations between the power amplifier output and the drive waveform input.

Referring to FIG. 1a, the inventor attempted to correct for dynamic phase errors between the drive waveform and the output of the power amplifier of a transmitter by means of a phase detector creating an error signal which drives a pre-correcting phase modulator. Any d.c. component of the phase error at the phase detector e.g. that produced even if the power amplifier produced no a.c. phase deviations at all, e.g. due to phase shifts along the cable connecting input B of the phase detector to the probe pick-up P, is not compensated for due to the capacitor C, and this does not matter in many circumstances. The error signal at the output of the difference amplifier performs excursions on the characteristic of the phase detector about an unknown d.c. component of A, B phase difference, a typical characteristic being shown in FIG. 1b, for example, the excursions indicated by X.

However, I have discovered two disadvantages with such an arrangement. First, it would only work if the operating point of the phase detector was on the correct (negative in this example) slope portion of the characteristic. Since the static phase error was unknown, the operating point could be on the wrong (positive in this example) slope portion, and this would result in positive feedback. More importantly, problems were caused with r.f. signals which exhibit cross-overs where there are momentary carrier breaks, e.g. SSB (Single Side Band) transmissions where a two-tone equal amplitude test signal is used. At the carrier breaks, one or both of the inputs A, B of the phase detector would fall to zero, and the phase detector would jump from its arbitrary d.c. level at X to zero, giving a large transient.

To overcome these disadvantages, I introduced a phase shifter and controller (shown dotted) and omitted capacitor C to attempt to hold the A, B phase difference at 90° (as in the phase quadrature detector of GB-A-1246209) i.e. at the operating region Y, so that carrier breaks would not result in a change of output of the phase detector. However, the phase shifter needed to execute phase shifts of up to 360° and operated slowly and in discrete steps. The result was that the phase detector output was held near the origin of FIG. 1b but, depending on the setting of a gain control in the loop between the differential amplifier and the phase modulator, deviated from it by a variable amount of dynamic phase error in operating region Y. However, since a linear multiplier was used for the phase detector (a digital phase detector being impracticable because of the carrier breaks), it turned out that the phase detector output was now dependent on the amplitudes of the signals at A and B as well as their phase. An attempt to incorporate limiters to eliminate the amplitude effects failed because indeterminate signals at the carrier breaks caused large transients. Similarly, the phase difference error signal voltage of GB-A-1246209 is only independent of the amplitudes of the inputs to the phase quadrature detector when those inputs are in quadrature relation, and this will only be true when the loop gain is large. However, the loop gain may not always be large, especially at higher modulation frequencies.

SUMMARY OF THE INVENTION

The invention provides a circuit for reducing phase distortion produced by an r.f. power amplifier for an r.f. signal source, comprising a main feedback loop for reducing phase errors between the output of the power amplifier and the r.f. signal source, the main feedback loop including a phase detector for generating an error signal, dependent on the phase of a signal derived from the power amplifier output relative to that of a signal derived from the r.f. signal source, a signal derived from the error signal being used to modulate the phase of the power amplifier input, and a subsidiary feedback loop by means of which a signal derived from the error signal is used to so modulate the phase of an input of the phase detector that small dynamic variations only of the phase detector output take place about a value which corresponds to a phase detector input of zero amplitude.

The subsidiary feedback loop enables the phase detector output to be held closely to the value which corresponds to a phase detector input of zero amplitude under all conditions, since the subsidiary loop can have a much wider bandwidth than that of the main feedback loop and hence a high subsidiary loop gain even at high modulation frequencies. This is because the correction products introduced into the r.f. signal in the subsidiary loop, unlike those introduced into the r.f. signal in the main feedback loop, do not have to go through the power amplifier and be delayed and/or have their bandwidth limited (e.g. by tuned circuits or physical cable lengths), before reaching the phase detector. This applies even if, as is sometimes desired, the gain in the main loop is turned down. Although the dynamic variations of the phase detector output are now extremely small, the error signal is still sufficient to reduce phase errors since it is a function of the product of the extremely small dynamic variations and the large subsidiary loop gain.

The problem of carrier breaks is overcome since a momentary phase detector zero input produces no change in output. The output of the phase detector is thus held to the value corresponding to an input of zero amplitude. Usually the phase detector output which corresponds to zero input will itself be zero, and this will usually correspond to a static phase error of 90° i.e. the operating point would be at the origin for the characteristic shown in FIG. 1b.

A phase modulator may be connected to the input of the phase detector that is arranged to received a signal derived from the power amplifier output. The phase detector is preferably a linear multiplier.

There may be provided means for varying the amount of signal derived from the error signal that is used to modulate the phase of the power amplifier input, thus allowing a varying degree of performance improvement to be provided by the system.

The static or d.c. component of the phase difference at the input to the phase detector may vary due to changing frequencies (the size of the power amplifier may be such that several wavelengths are accommodated between the input and the output of the power amplifier, and this will change at different frequencies), or by atmospheric conditions such as temperature at the antenna of a transmitter, which could cause a drift of the output phase relative to the drive waveform phase. Preferably, the circuit includes a phase shifting circuit which is operative in response to a signal derived from the error signal reaching a value corresponding to an end of the range of a phase modulator it controls. The phase shifting circuit is brought into operation in the case of a large non-dynamic phase deviation e.g. changing frequency or due to temperature, to bring the phase modulator back within its operating range. The latter may be in an input to the phase detector, and the phase shifting circuit may also be in that input, or it may be in the input to the power amplifier. The phase shifting circuit may include a comparator with a pair of threshold values, the phase shifting circuit being so controlled that it varies the phase shift when the error signal crosses the threshold values.

The invention is especially applicable to medium frequency, high frequency and VHF (300KHz to 300 MMz) and particularly to medium and high frequency (30KHz to 30 MHz).

BRIEF DESCRIPTION OF THE DRAWINGS

A high frequency SSB radio transmitter constructed in accordance with the invention will now be described, by way of example, with reference to the accompanying drawings, in which:

FIG. 1b is a diagram illustrating the characteristics of a phase detector used in the circuit of FIG. 1a;

FIG. 2 shows an SSB waveform of a two-tone test signal;

FIG. 3 shows a typical frequency spectrum of the SSB waveform of FIG. 2;

FIG. 4 shows one form which the divider circuit in FIG. 1c can take; and

FIG. 5 shows one form which the phase shifting circuit in FIG. 1c can take.

DESCRIPTION OF THE PREFERRED EMBODIMENTS

Figure 1A:
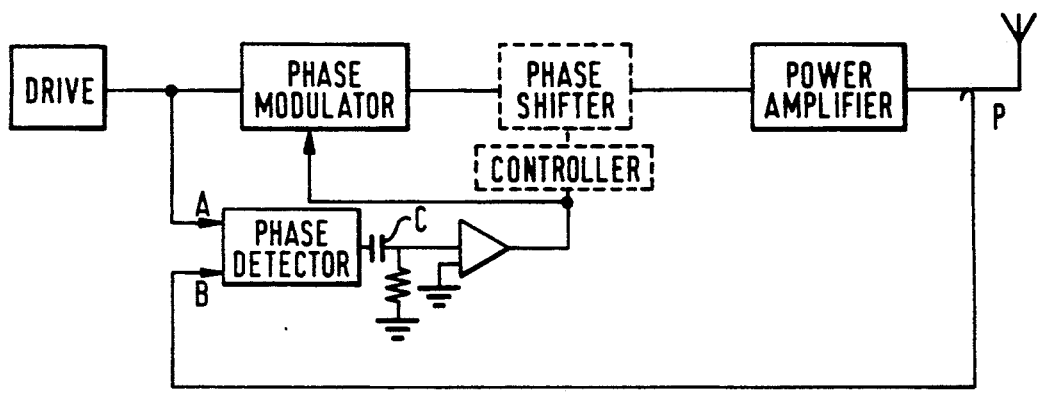
FIG. 1a shows an initial circuit developed in an attempt to reduce distortion produced by an r.f. power amplifier.
Figure 1B:
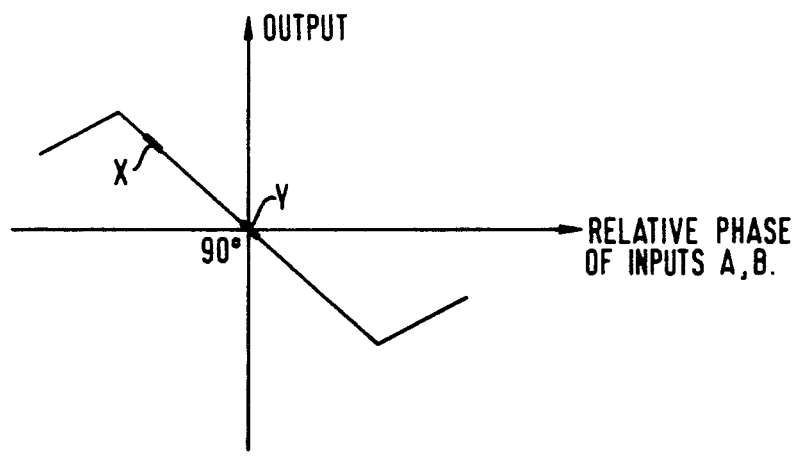
Figure 1C:
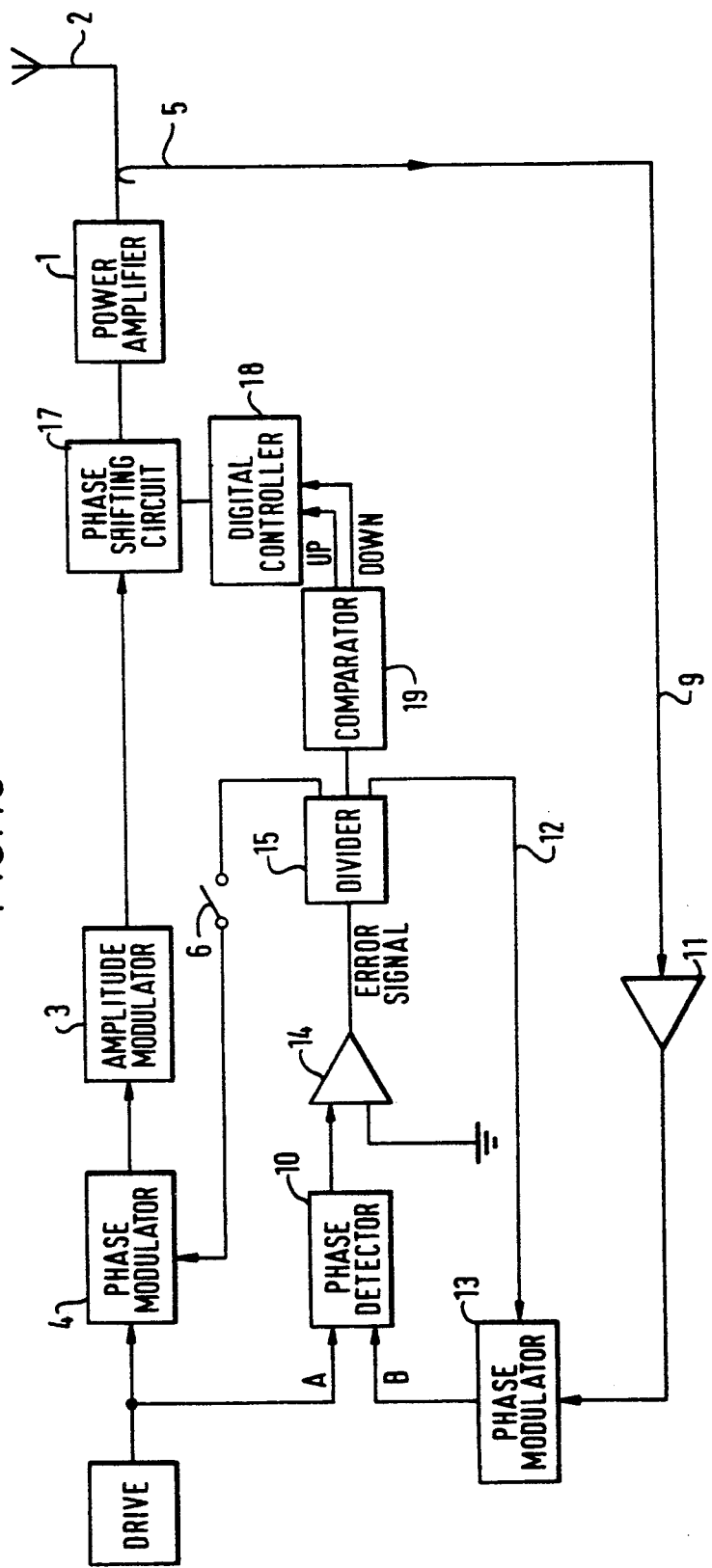
FIG. 1c is a block diagram of a part of a high frequency radio transmitter.

The radio transmitter of FIG. 1c generates an r.f. signal source in the form of an SSB drive waveform, for example, the test signal of FIGS. 2 and 3. This is produced by amplitude modulating a pair of audio frequencies of equal amplitude onto a carrier, and then filtering one of the sidebands and the carrier (shown dotted) from the signal. Power amplification takes place at a power amplifier 1 feeding an antenna 2.

The transmitter is relatively high power and, even though the power amplifier consists of a series of linear amplifiers, it is prone to exhibit non-linearity and distort the drive waveform. This would be manifested, in the case of a test signal of two pure audio tones of 1 kHz and 2 kHz of equal amplitude modulated onto the carrier, as various additional lines (intermodulation products) in the frequency spectrum of the power amplifier and hence the transmitter output apart from those corresponding to the two audio tones. The additional lines must be suppressed below defined limits in order to avoid interference with adjacent radio channels, and also to reduce distortion in the recovered audio signal. The invention aims to reduce or eliminate this distortion by separately applying relative envelope amplitude and relative phase error signals to amplitude modulator 3 and phase modulator 4.

A suitable circuit for controlling amplitude modulator 4 is disclosed and claimed in our co-pending British patent application number 9002788.9, and other parts of the circuit are claimed in co-pending British patent application numbers 9002786.3 and 9002787.1.

To produce a phase pre-correcting signal, it is necessary to, measure the phase-difference between the r.f. signals within the input and output envelopes. This must be done continuously over the modulation cycle, irrespective of the amplitudes or absolute phases of the signals arriving at the phase detector, (due for example to arbitrary cable lengths). It must also be unaffected by the momentary carrier breaks appearing within SSB signals.

Of course, the propagation delay through a physically large equipment, and the electrical length of an amplifier containing several tuned circuits, means that the phase comparison is in fact done between two r.f. cycles which are separated in time. In practice, the effect of this is to set an upper limit on the correction loop gain/bandwidth product. However, with careful design, it is quite possible to obtain satisfactory results, as there are always many r.f. cycles within one cycle of even the highest modulating frequency.

Phase errors between the power amplifier output and the drive input are corrected by means of main phase correction feedback loop 9, feeding phase modulator 4. Phase detector 10 compares the phase at terminal A of the instantaneous r.f. input signal with the phase at terminal B of a signal derived (by means of pick-up 5) from the r.f. output of the power amplifier which is fed along main phase correction loop 9 via buffer 11 (ignoring for the moment phase modulator 13). The phase detector 10 is a linear multiplier the characteristic of which is as shown in FIG. 1b.

Any instantaneous differences in the phase of the r.f. signals at the input ports A, B (dynamic phase errors) will be amplified by a difference amplifier 14, and the resulting error signal is fed via divider network 15 to the phase modulator 4. This modulates the phase of the input to the power amplifier in such a sense as to reduce the deviation of the output phase from the drive waveform phase i.e. phase modulator 4 is a pre-correcting phase modulator, with the result that the error signal at the output of the amplifier 14 performs variations on either side of zero volts and the inputs at A and B tend to be maintained in phase quadrature. Phase shifting circuit 17 (described below) pre-corrects for static phase errors.

A problem with the above arrangement is that the loop gain is not large at high modulation frequencies (the loop including a roll-off to maintain stability at maximum correction), and in any case it may be desired that the error signal is attenuated between divider 15 and phase modulator 4 (e.g. in order to turn the correction down for test purposes). In these circumstances, the excursion of the dynamic variations at the phase detector output varies. The phase detector output unfortunately depends not only on the phase of the inputs but also on their amplitudes and will therefore produce inaccurate results.

To prevent the disadvantage a subsidiary local phase lock loop 12 is provided, controlling the phase modulator 13. Amplifier 14 has high gain e.g. greater than one thousand, preferably greater than ten thousand or even a hundred thousand, and so the output of phase detector 10 is now vanishingly small. Hence, the dynamic variations are now so small that the output of the detector 10 depends only on relative phase of A, B, not on their relative amplitudes. Of course the error signal is the product of these minute dynamic variations with a large loop gain due to amplifier 14, and so the dynamic variations of the error signal are not minute, but sufficient to drive phase modulators 4 and 13. It would not be possible to employ an amplifier 14 with such a large gain if the subsidiary loop 12 were not provided because the delay around the main loop is so great, and because of phase shifts in the tuned circuit of the power amplifier. Because the error signal used for phase correction is generated by the subsidiary loop, the option exists of turning down the gain of the main loop (by potentiometer $RV_1$—see later) or of switching the correction off altogether by opening switch 6. Indeed if the local loop was not provided, amplifier 14 would limit when the switch was open. Then, when it was again closed, a spurious error signal would be fed to divider 15 and the phase adjusted incorrectly at phase modulator 4. The local loop prevents this because phase modulator 13 holds the amplifier 14 in its operating range even when phase modulator 4 is switched off.

In addition, the arrangement is not prone to spurious outputs at carrier breaks. The signal derived from the error signal is fed by divider 15 to phase modulator 13 in such a sense as to hold input A and B in quadrature even during the cross-overs (when a large phase detector output could otherwise instantaneously result), by adjusting the phase modulator 13 and therefore adjusting the phase of input B appropriately. If desired, the phase modulator 13 could be placed in series with the other input A of the phase modulator. Operation is thus confined to the origin in FIG. 1b. Thus, since the phase detector output is normally zero with inputs, a momentary zero cannot give a change of output. Of course, phase differences other than 90° could be employed to produce zero output. For that matter, a zero input could correspond to a non-zero output, and the phase difference across the inputs would then be held to whatever value produced that output.

It will be appreciated that the circuit described above would be imperfect if the error signal was split equally by divider 15 between phase modulator 4 and phase modulator 13, in that only about half the error signal necessary to correct for phase errors in the amplifier 1 would be fed to phase modulator 4, the other half being fed to phase modulator 13. It is for this reason that a steering network such as is shown in FIG. 4 is provided. On transmitter start-up switch 6 is open, and all the error signal passes in the subsidiary loop to phase modulator 13. Then switch 6 is closed, and potentiometer $RV_1$ is adjusted to slowly increase the gain of the main correction loop. As this happens, the correction performed by phase modulator 4 increases, and thus the a.c. component of the error signal 14 decreases. Eventually a point is reached where the a.c. component of the error signal is steered entirely to phase modulator 4, so that the maximum correction possible of the power amplified signal takes place, and none or only a very small proportion of the error signal passes to phase modulator 13. What does pass to phase modulator 13 is the d.c. component of the error signal, to keep the operating point of the phase detector 10 at the origin of FIG. 1b even if phase shifts along the main correcting loop vary e.g. due to temperature variations.

Referring to FIG. 4, the steering network consists of diodes D1 and D2 connected in anti-parallel which only conduct when the error signal exceeds their turn-on voltage of around 0.7 volts. (Alternatively, opposed series Zener diodes could be used). These ensure that the a.c. component of the error signal (which is typically 1 volt peak to peak) is steered to a gain adjustment control for the phase modulator 4 consisting of a potentiometer $RV_1$ and a dc blocking capacitor C1. The d.c. component of the error signal is blocked by capacitor C1 from passing to phase modulator 4 and passes instead to phase modulator 13 and (as will be seen later) phase shifter circuit 17, resistors R1 and R2 being chosen with this in mind and to prevent any substantial a.c. signal by passing the diodes via the resistor R1. The a.c. component is amplified by amplifier 16 before being fed to phase modulator 4.

When the switch 6 is open, the error signal will exceed a peak to peak voltage of 1.4 volts, and all the correction necessary to keep the difference amplifier 14 from limiting is performed by phase modulator 13. All the error signal appears across the diodes, both ac and dc components, and the additional loop maintains the inputs A and B in quadrature, even though no voltage is fed to modulator 4 which is therefore switched off. When the switch is closed, the potentiometer $RV_1$ is varied to gradually increase the signal to the modulator 4, so that the turn-on voltage of the diodes is not exceeded and nearly all the ac correction signal is steered to modulator 4, this happening without a sudden modulation from phase modulator 4.

The phase shifting circuit 17 will now be described with reference to FIG. 5. In the case of a high frequency transmitter operating over a wide frequency range, the phase difference between the output and the input of the transmitter could amount to several wavelengths, and when the operating conditions are changed e.g. the temperature changes, the phase difference could change significantly. If the frequency of the transmitter varies the phase difference will change to significant extent. It follows that variations in phase between the drive waveform and the transmitter output could be any value between 0° and 360° and cannot be compensated for by phase modulator 13 which only compensates for phase errors of +or −20°. Any larger variations would be difficult to accommodate in phase modulator 13 in view of the wide bandwidth of frequencies it has to cover.

For this reason, the compensation circuit includes the phase shifting circuit 17 controlled by a digital controller 18 which is in turn controlled by an end stop detector or comparator 19 fed by the phase error signal. The circuit 17 is capable of continuously shifting the phase between its input and output through any angle between 0° and 360°.

In the event of the d.c. component of the error signal being in excess of that corresponding to the maximum phase shift which can be produced by the phase modulator 13, the end stop detector 19, which is a dual voltage comparator having upper and lower threshold values, instructs the digital controller 18 to adjust the phase shift produced by the phase shift network 17. This continuously adjusts the phase shift until the error signal falls below the upper threshold or rises above the lower threshold. This causes the digital controller to stop at its instantaneous phase shift when the threshold has been crossed, at which value the phase error between drive waveform and transmitter output is within the range of correction by phase modulator 13. The phase shift network can, if desired, be incorporated in the local loop 12.

It is necessary that the controller 18 and phase shift circuit be cyclic in operation so that there is no discontinuity in phase shift between e.g. 360° and 361°. Referring to FIG. 5 the phase shifting circuit includes a broadband quadrature network 20 which, over the range of frequencies of the transmitter, produces outputs which have a constant 90° phase difference over all frequencies. Such a circuit could consist of a number of rows of series resistors with capacitors coupling adjacent rows in a diagonal arrangement, commonly known as a polyphase network.

The digital controller is a ROM with sine and cosine values. When the error signal from divider 15 exceeds the upper threshold of the comparator 19, the comparator clocks in one direction through the ROM addresses generating digital values of the functions ksinz and kcosz, which are converted to analogue form and fed to its two outputs, which values are multiplied by the two outputs of the network 20 by means of multipliers 21, 22. The product outputs are combined and amplified by amplifier 23. When the phase correction applied to the transmitter input is sufficient to reduce the error signal below that threshold, the controller stops at the respective sine and cosine values and the phase shift network produces a constant phase shift. Similarly, when the error signal from the divider 15 falls below the threshold of the comparator 19 the comparator clocks in the other direction through the ROM addresses producing values of sine and cosine functions through progressively decreasing angles, until the error signal rises above the lower threshold, whereupon the controller again stops at the respective sine and cosine values. The end-stops of the subsidiary phase lock loop are only reached occasionally (for example at frequency changes or due to slow drifts in the equipment). It is therefore unnecessary for the phase shifting circuits to work particularly rapidly. In practice, it takes about one second to track round the full 360 degrees. The circuit is fitted in the forward path to the power amplifier input so that any distortion it may produce will be cancelled by the correction; if it was in the feedback path, any distortion produced would be added.

It will be apparent that the circuit of FIG. 5 is operative to produce any phase shift and, very importantly, with constant amplitude. By this means, it is possible to introduce an arbitrary phase-shift to the r.f. envelope and maintain this phase at the correct value continuously, without altering the r.f. amplitude. When $z=0$ the phase shift circuit will produce 90° phase shift since $\sin 0 = 0$ and $\cos 0 = 1$. When $z = 45°$, both sin 45 and cos 45 are equal to 0.707, and the vectorial addition of equal amounts of 0° phase shift and 90° phase shift signal will be 45°. Other angles can be deduced in a similar manner.

Because the sine and cosine functions are cyclic, there is no discontinuity at 360°. Instead of sine and cosine functions, successively rising and falling ramp signals, 90° out of phase, could be used instead (although they would give varying amplitude). Also, any two values of the phase shift in quadrature could be used instead e.g. 270° and 360° as an alternative to 0° and 90°.

The phase shifting circuit 17 could be omitted for an appropriate fixed frequency transmitter. It could be replaced by a circuit for producing a fixed phase shift sufficient to bring phase modulator 13, which could in fact have a few degrees of correction, into its range of operation.

The transmitter could operate between 3.9 and 28 MHz, and its power could be 500 kW. However, the invention is applicable to any high frequency or medium frequency transmitter. It will be apparent that the compensation circuit may be built into a transmitter, but that it may also be connected to an existing transmitter. Also, the circuit described could form part of any type of transmitter in which amplitude dependent phase shifts are likely to be produced e.g. reduced carrier operation, or a.m., f.m., or TV or radar. Further, the circuit may be used for r.f. power amplifiers which are not part of a transmitter but serve some other function. The invention is applicable for reducing or eliminating phase distortion in any linear power amplifier e.g. class A, B or class AB.

The invention is also applicable to the Kahn system. The circuit is as described with reference to FIG. 1c, except that the SSB signal is split into amplitude and phase components at low level, i.e. within the drive, and the phase component is used as a constant amplitude but phase-modulated r.f. input to the amplifier chain now operating in class C (power amplifier 1), while the envelope amplitude information, which of course is a quasi-audio signal, is used to drive an amplitude modulator, which is a switched mode device in series with the H.T. supply to the final amplifier. The amplitude modulator 3 is omitted, and a limiter is included in the main feedback loop 9, so that both inputs of the phase detector 10 are of constant amplitude. The phase and amplitude components come together again only at the transmitter output. In this case, only the carrier phase is corrected. The reason for this is that the propagation delay of the modulator is too large for direct audio-frequency feedback around it to be practicable; amplitude correction cannot be applied to the r.f. stages, as they operate in class C, so that any amplitude variations at their input will be lost.

I claim:

1. A circuit for reducing phase distortion produced by an r.f. power amplifier from an r.f. signal source, comprising a main feedback loop for reducing phase errors between the output of the power amplifier and the r.f. signal source, the main feedback loop including a phase detector for generating an error signal, dependent on the phase of a signal derived from the power amplifier output relative to that of a signal derived from the r.f. signal source, a signal derived from the error signal being used to modulate the phase of the power amplifier input, and a subsidiary feedback loop by means of which a signal derived from the error signal is used to so modulate the phase of an input of the phase detector that small dynamic variations only of the phase detector output take place about a value which corresponds to a phase detector input of zero amplitude.

2. A circuit as claimed in claim 1, including a steering network in the error signal path, for steering a.c. components within a given amplitude along the main feedback loop for modulating the phase of the power amplifier input and d.c. components along the subsidiary feedback loop for modulating the phase of the input of the phase detector.

3. A circuit as claimed in claim 2, in which the steering network is such that a.c. components above the said given amplitude pass along the subsidiary feedback loop.

4. A circuit as claimed in claim 2, in which the steering network includes a pair of diodes arranged in opposition.

5. A circuit as claimed in claim which includes means for varying the amount of error signal to be fed along the main feedback loop.

6. A circuit as claimed in claim 1, including a phase shifting circuit operative in response to a signal derived from the error signal reaching a value corresponding to an end of the range of a phase modulator it controls.

7. A circuit as claimed in claim 6, including a comparator with upper and lower threshold values, the phase shifting circuit being so controlled that it varies the phase shift in response to a signal derived from the error signal crossing a threshold value.

8. A circuit as claimed in claim 6, in which the phase shifting circuit is capable of producing a phase shift of any angle between 0° and 360°, without a discontinuity between 360° and 0°.

9. A circuit as claimed in claim 6, including a digital circuit for controlling the phase shifting circuit.

10. A circuit as claimed in claim 6, in which the phase shifting circuit is in the path of the input of the power amplifier.

11. A circuit as claimed in claim 6, in which the phase shifting circuit comprises a broadband phase shifter for producing outputs with quadrature phase shift relative to each other, and means for multiplying each output with respective cyclic functions, which are also in quadrature, and for combining the multiplied signals to produce a given phase shift.

12. A circuit as claimed in claim 1, in which the power amplifier is suitable for use in a transmitter.

13. A circuit as claimed in claim 12, in which the power amplifier is suitable for use in an SSB transmitter.

14. An r.f. transmitter including a circuit for reducing distortion produced by an r.f. power amplifier from an r.f. signal source, said circuit for reducing distortion comprising a main feedback loop for reducing phase errors between the output of the power amplifier and the r.f. signal source, said main feedback loop including a phase detector for generating an error signal dependent on the phase of a signal derived from the power amplifier output relative to that of a signal derived from the r.f. signal source, a signal derived from the error signal being used to modulate the phase of the power amplifier input, and a subsidiary feedback loop by means of which a signal derived from the error signal is used to so modulate the phase of an input of the phase detector that small dynamic variations only of the phase detector output take place about a value which corresponds to a phase detector input of zero amplitude.

15. A circuit for reducing distortion produced by an r.f. power amplifier having an input coupled to an r.f. signal source, comprising a phase detector having a first input coupled to said r.f. signal source, a second input coupled to an output of said power amplifier, and an output, an error signal being generated at the output of said phase detector which is dependent on the phase difference between the signals at the first and second inputs thereof;

first and second phase modulators, said first phase modulator being interposed between said r.f. signal source and the input of said power amplifier and said second phase modulator being interposed between the output of said power amplifier and the second input of said phase detector; and divider means coupled to the output of said phase detector, said divider means coupled in a.c. components of said error signal to said first phase modulator for modulating the phase of the signal at the input of said power amplifier, said divider means further coupling d.c. components of said error signal to said second phase modulator for modulating the phase of the signal at the second input of said phase detector.

16. A circuit as claimed in claim 15 which further comprises a phase shifting circuit interposed between said first amplitude modulator and the input of said power amplifier, said phase shifting circuit being further coupled to said divider for varying the phase of the signal at the input of said power amplifier when said error signal crosses a threshold value.

* * * * *